(12) United States Patent
Lee

(10) Patent No.: US 7,842,545 B2
(45) Date of Patent: Nov. 30, 2010

(54) SEMICONDUCTOR PACKAGE HAVING INSULATED METAL SUBSTRATE AND METHOD OF FABRICATING THE SAME

(75) Inventor: Keun-hyuk Lee, Bucheon-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 0 days.

(21) Appl. No.: 12/641,554

(22) Filed: Dec. 18, 2009

(65) Prior Publication Data

US 2010/0093134 A1    Apr. 15, 2010

Related U.S. Application Data

(62) Division of application No. 12/264,292, filed on Nov. 4, 2008, now Pat. No. 7,659,559.

(51) Int. Cl.
*H01L 21/44* (2006.01)
*H01L 21/48* (2006.01)
*H01L 21/50* (2006.01)

(52) U.S. Cl. ............... 438/106; 438/112; 257/E21.499

(58) Field of Classification Search .......... 438/106, 438/112, 123, 124; 257/E21.499
See application file for complete search history.

(56) References Cited

U.S. PATENT DOCUMENTS 7,550,322 B2 *   6/2009   Kimura ............... 438/126

* cited by examiner

*Primary Examiner*—Hoai V Pham
(74) *Attorney, Agent, or Firm*—Thomas R. FitzGerald, Esq.; Hiscock & Barclay, LLP

(57) ABSTRACT

Provided is a semiconductor package in which an adhesion force between an insulation metal substrate and a molding member is increased by removing a solder mask layer from the insulation metal substrate and a method of fabricating the semiconductor package. The semiconductor package includes an insulation metal substrate that includes a base member, an insulating layer disposed on the base member, and conductive patterns formed on the insulating layer. Semiconductor chips are arranged on the conductive patterns. Solder mask patterns are arranged on the conductive patterns to surround the semiconductor chips. Leads are electrically connected to the conductive patterns through wires. A sealing member is arranged on an upper surface and side surfaces of the substrate to cover portions of the leads, the wires, the semiconductor chips, and the solder mask patterns.

7 Claims, 4 Drawing Sheets

SEMICONDUCTOR PACKAGE HAVING INSULATED METAL SUBSTRATE AND METHOD OF FABRICATING THE SAME

CROSS-REFERENCE TO RELATED PATENT APPLICATION

This application is a divisional of U.S. patent application Ser. No. 12/264,292 filed Nov. 4, 2008, which claims the benefit of Korean Patent Application No. 10-2008-0006710, filed on Jan. 22, 2008, in the Korean Intellectual Property Office, the disclosures of which are incorporated herein in their entirety by reference.

BACKGROUND OF THE INVENTION

1. Field of the Invention

The present invention relates to a semiconductor package, and more particularly, to a semiconductor package in which an adhesive force between an insulating metal substrate (IMS) and a molding member is improved and a method of fabricating the same.

2. Description of the Related Art

In a semiconductor power module package, a power semiconductor chip and a control semiconductor chip are integrated in one package. Semiconductor power devices include silicon-control rectifiers, power transistors, insulated-gate bipolar transistors (IGBTs), power regulators, inverters, and converters. Such power devices are operated at a high voltage of 30 to 1000V or above unlike a low voltage device such as memory devices, and thus, require a high heat dissipation capability and an insulation capability at a high voltage.

A semiconductor power module package uses an insulating metal substrate (IMS) or a direct bonded copper (DBC) substrate as a supporting substrate. The DBC substrate may include a ceramic insulating layer formed of $Al_2O_3$, an upper conductive film formed of Cu arranged on an upper surface of the ceramic insulating layer, and a lower conductive film formed of Cu arranged on a lower surface of the ceramic insulating layer. The insulating metal substrate (IMS) includes a metal base member, an insulating layer disposed on the metal base member, and conductive patterns formed on the insulating layer. The IMS further includes a solder mask layer for die soldering. The solder mask layer is formed on the insulating layer to cover the entire metal patterns except portions of the metal patterns to be die-bonded or wire bonded.

In a method of fabricating a semiconductor power module package having the IMS, the IMS on which a solder mask layer is formed is prepared, a semiconductor chips are die bonded on the IMS using the solder mask layer, and the semiconductor chips and leads are wire bonded. Next, a sealing member is formed to cover the wires, and the semiconductor chips.

In the case of the semiconductor power module package having the IMS, both the solder mask layer and the sealing member are formed of an epoxy group material, and the solder mask layer directly contacts the sealing member when performing a process of forming the sealing member, and thus, an adhesion force therebetween is weak. Thus, due to the poor adhesion at an interface between the solder mask and the sealing member, an insulation breakdown voltage is reduced and an insulating characteristic is greatly reduced.

SUMMARY OF THE INVENTION

To address the above and/or other problems, the present invention provides a semiconductor package in which an adhesion force between an insulating metal substrate (MIS) and a sealing member is increased by partly or completely removing the solder mask layer for die soldering from the MIS, and a method of fabricating the semiconductor package.

According to an aspect of the present invention, there is provided a semiconductor package. The semiconductor package may include an insulation metal substrate. The insulation metal substrate may include a base member, an insulating layer disposed on the base member, and conductive patterns formed on the insulating layer. Semiconductor chips may be arranged on the conductive patterns. Solder mask patterns are arranged on the conductive patterns to only surround the semiconductor chips. Leads may be electrically connected to the conductive patterns through wires. A sealing member may be arranged on an upper surface and side surfaces of the insulation metal substrate to expose the base member. The sealing member may cover portions of the leads, the wires, the semiconductor chips, and the solder mask patterns.

The solder mask patterns may comprise an epoxy resin, and the sealing member may comprise an epoxy resin.

The base member may comprise an Al plate, and the conductive patterns may be formed of Cu, Au, Ag, Al, or Ni. The semiconductor package may comprise a power module package.

According to another aspect of the present invention, there is provided a semiconductor package. The semiconductor package includes an insulation metal substrate comprising a base member formed of an Al plate, an insulating layer formed of an epoxy resin group and disposed on the base member. Conductive patterns are formed on the insulating layer. Semiconductor chips are arranged on the conductive patterns. Leads are electrically connected to the conductive patterns through wires. A sealing member that comprises a transfer molded epoxy resin and is arranged on an upper surface and side surfaces of the insulation metal substrate covers portions of the leads, the wires, and the semiconductor chips.

According to an aspect of the present invention, there is provided a method of fabricating a semiconductor package. An insulation metal substrate comprising a base member, an insulating layer arranged on the base member, conductive patterns formed on the insulating layer, and a solder mask layer formed on the insulating layer including the conductive patterns, is prepared. The solder mask layer is completely removed or patterned to remain at peripherals of portions of the conductive patterns where semiconductor chips are mounted to expose the conductive patterns. The semiconductor chips are mounted on exposed portions of the conductive patterns. The conductive patterns are electrically connected to leads through wires. A sealing member is formed on an upper surface and side surfaces of the insulation metal substrate to cover the semiconductor chips, the wires, and portions of the leads and to be in contact with remaining exposed portions of the conductive patterns.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
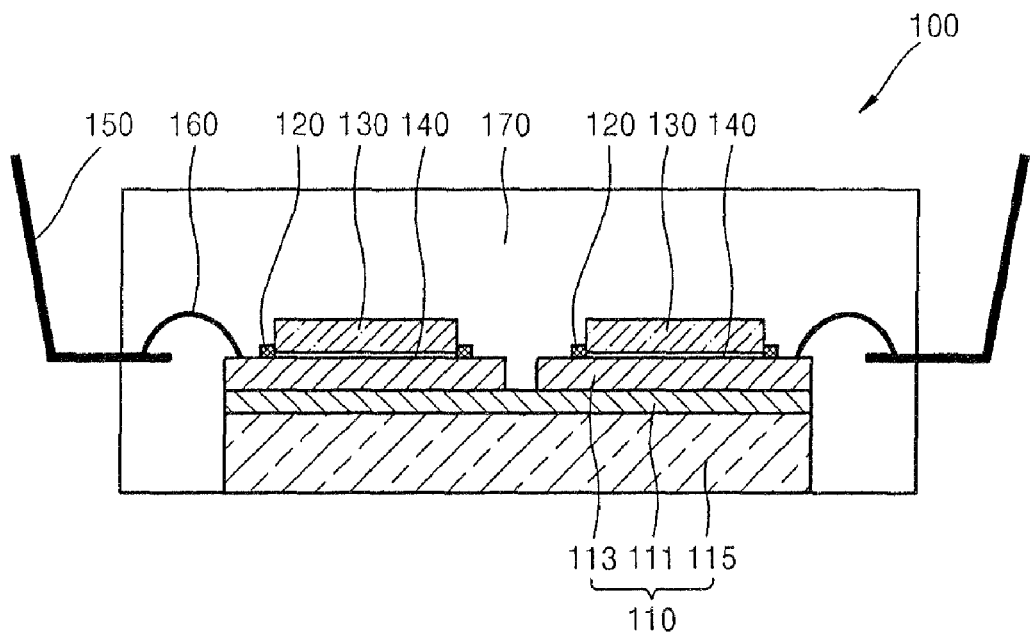
FIG. 1 is a cross-sectional view of a semiconductor package according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

FIG. 1 is a cross-sectional view of a semiconductor package 100 according to an embodiment of the present invention. Referring to FIG. 1, the semiconductor package 100 includes an insulating metal substrate 110. The insulating metal substrate 110 includes a base member 115, an insulating layer 111 disposed on the base member 115, and a conductive layer formed on the insulating layer 111. The base member 115 performs as a cooling body and may include an Al plate having a high heat radiation characteristic. The insulating layer 111 has a high heat-resistance and insulating characteristics, and may be formed of an epoxy resin. The conductive layer includes metal patterns 113 patterned by a predetermined design pattern. The metal patterns 113 may be formed of a metal having high conductivity, for example, Cu, Au, Ag, Al, or Ni.

Semiconductor chips 130 are mounted on the metal patterns 113 of the insulating metal substrate 110. The semiconductor chips 130 are attached to the metal patterns 113 using solder pads 140. Solder mask patterns 120 are formed on the metal patterns 113 to surround the semiconductor chips 130. The solder mask patterns 120 may be formed to have a minimum width so that the solder mask patterns 120 can only act as solder masks during performing a soldering process for attaching the semiconductor chips 130 to the metal patterns 113. The solder mask patterns 120 may include an epoxy resin.

The metal patterns 113 are electrically connected to leads 150 through wires 160. If the semiconductor package 100 is a power module package, semiconductor chips may include power semiconductor chips and/or control semiconductor chips. Although not shown, the semiconductor chips 130 may be electrically connected to the metal patterns 113 or electrically connected to leads through wires.

A sealing member 170 is formed to cover the semiconductor chips 130, the wires 160, the solder mask patterns 120, and portions of the leads 150. The sealing member 170 may include a transfer molded epoxy resin. The sealing member 170 is formed to cover an upper surface and side surfaces of the insulating metal substrate 110 to expose the base member 115 of the insulating metal substrate 110. Since the solder mask patterns 120 are formed around the semiconductor chips 130, the sealing member 170 directly contacts the metal patterns 113, and thus, an interface adhesion force between the sealing member 170 and the insulating metal substrate 110 is increased.

Figure 2:
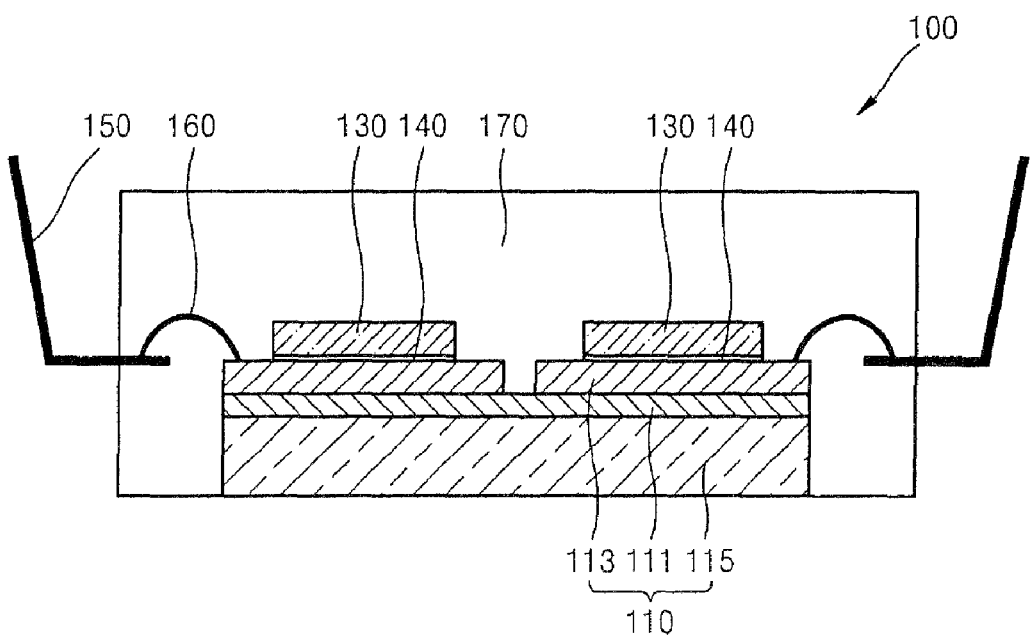
FIG. 2 is a cross-sectional view of a semiconductor package according to another embodiment of the present invention.

FIG. 2 is a cross-sectional view of a semiconductor package 100 according to another embodiment of the present invention. Referring to FIG. 2, the semiconductor package 100 includes an insulating metal substrate 110. The insulating metal substrate 110 includes a base member 115, an insulating layer 111 disposed on the base member 115, a metal layer formed on the insulating layer 111. The base member 115 operates as a cooling body and may be formed of an Al plate having a high heat radiation characteristic. The insulating layer 111 has a high heat resistance and insulating characteristic and may be formed of an epoxy resin. The metal layer includes metal patterns 113. The metal patterns 113 may be formed of a metal having high conductivity, for example, Cu, Au, Ag, Al, or Ni.

Semiconductor chips 130 are mounted on the metal patterns 113 of the insulating metal substrate 110. The semiconductor chips 130 are attached to the metal patterns 113 through solder pads 140. No solder mask layer 120a (refer to FIG. 4A) remains on an upper surface of the insulating metal substrate 110 since the solder mask layer 120a is completely removed from the upper surface of the semiconductor package 100. The metal patterns 113 are electrically connected to leads 150 through wires 160. If the semiconductor package 100 is a power module package, the semiconductor chips 130 may include power semiconductor chips and/or control semiconductor chips.

Although not shown, the semiconductor chips 130 may be electrically connected to the metal patterns 113 through wires or may be electrically connected to leads. A sealing member 170 is formed to cover the semiconductor chips 130, the wires 160, and portions of the leads 150. The sealing member 170 may include a transfer molded epoxy resin. The sealing member 170 is formed to cover an upper surface and side surfaces of the insulating metal substrate 110 to expose the base member 115 of the insulating metal substrate 110. Since a solder mask layer is completely removed, the sealing member 170 directly contacts the metal patterns 113 without the solder mask layer, and thus, an interface adhesion force between the sealing member 170 and the insulating metal substrate 110 is increased.

Figure 3A:
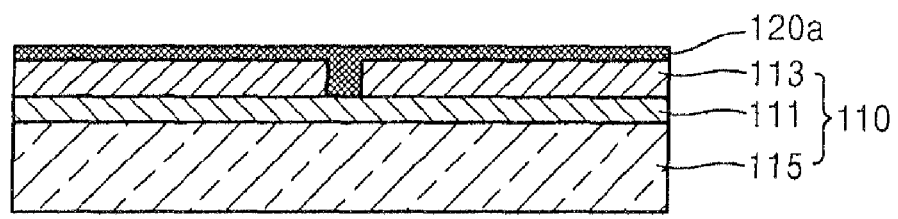
FIGS. 3A through 3D are cross-sectional view for explaining a method of fabricating the semiconductor package of FIG. 1, according to an embodiment of the present invention.

FIGS. 3A through 3D are cross-sectional views for explaining a method of fabricating the semiconductor package 100 of FIG. 1, according to an embodiment of the present invention. Referring to FIG. 3A, an insulating metal substrate 110 on which a solder mask layer 120a is formed on an entire surface thereof is prepared. The insulating metal substrate 110 includes a base member 115, an insulating layer 111, and metal patterns 113. The solder mask layer 120a is formed on the entire surface of the insulating layer 111 including the metal patterns 113.

Figure 3B:
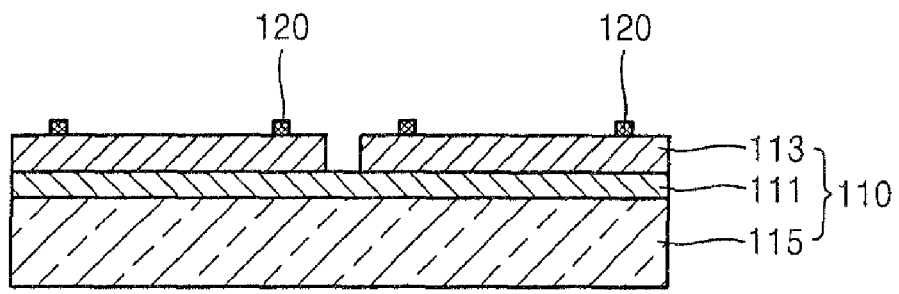

Referring to FIG. 3B, solder mask patterns 120 are formed by etching the solder mask layer 120a to define semiconductor chip regions of the metal patterns 113 on which semiconductor chips will be mounted in a subsequent process. The solder mask patterns 120 may be removed except for remaining portions that can perform as a solder mask during die bonding the semiconductor chips. The remaining portions of the solder mask 120 form an annular region surrounding a die attach area on the metal patterns. The annular solder mask is spaced from the edges of the metal patterns to expose the edges for contact to the sealing member.

Figure 3C:
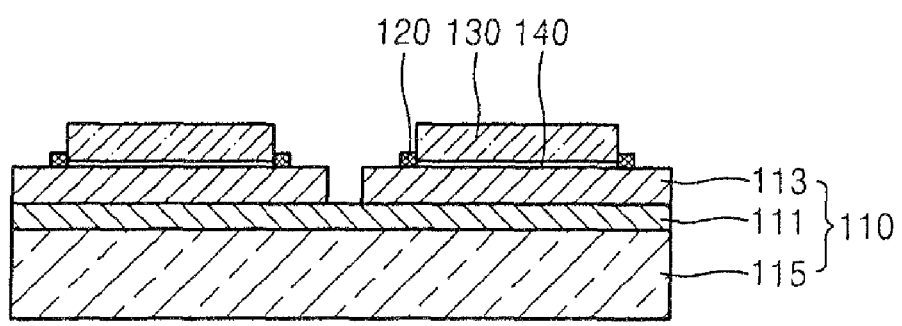
Figure 3D:
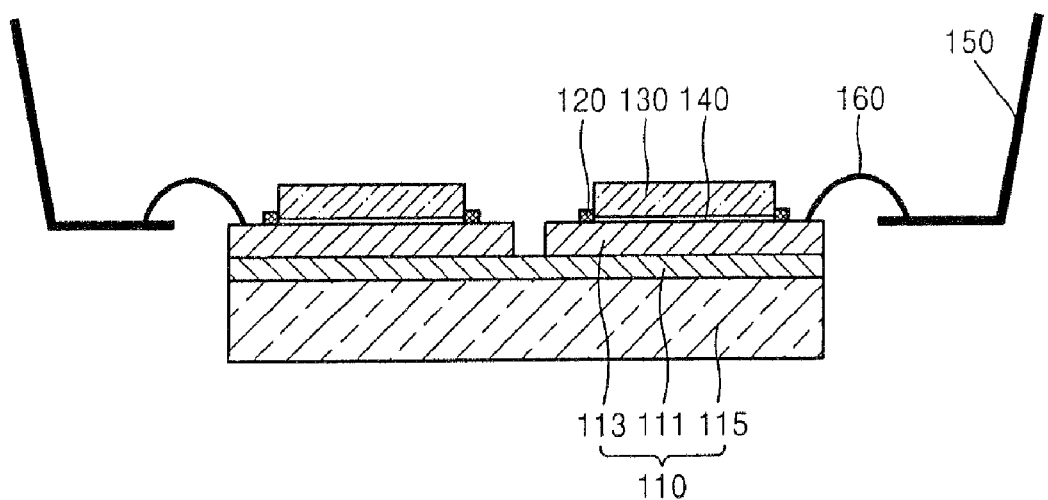

Referring to FIG. 3C, semiconductor chips 130 are attached to the semiconductor chip regions defined by the solder mask patterns 120 by performing a die bonding process using solder pads 140. The solder mask patterns 120 are only disposed to surround the semiconductor chips 130. Referring to FIG. 3D, the metal patterns 113 are electrically connected to leads 150 through wires 160 by performing a wire bonding process. Although not shown, the semiconductor chips 130 may be electrically connected to the metal patterns 113 through wires or the semiconductor chips 130 may be electrically connected to the leads 150 through wires.

A sealing member 170 is formed on an upper surface and side surfaces of the insulating metal substrate 110 to cover the wires 160, the semiconductor chips 130, and portions of the leads 150, and to expose the base member 115 by performing a transfer molding process. The sealing member 170 may include an epoxy resin. A contact area between the sealing member 170 and the metal patterns 113 is relatively greater than a contact area between the sealing member 170 and the solder mask patterns 120 formed of epoxy resin, and thus, an interface adhesion force between the sealing member 170 and the insulating metal substrate 110 is greatly increased.

Figure 4A:
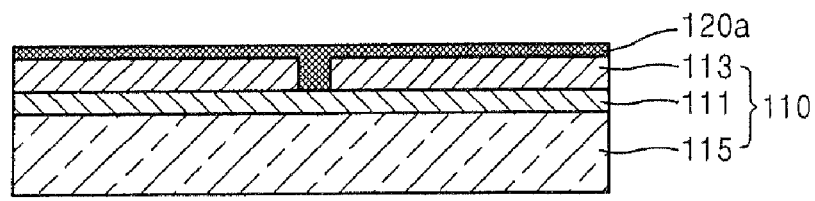
FIGS. 4A through 4D are cross-sectional view for explaining a method of fabricating the semiconductor package of FIG. 2, according to another embodiment of the present invention.

FIGS. 4A through 4D are cross-sectional views for explaining a method of fabricating a semiconductor package 100 of FIG. 2, according to another embodiment of the present invention. Referring to FIG. 4A, an insulating metal substrate 110 on which a solder mask layer 120a is formed on an entire surface thereof is prepared. The insulating metal substrate 110 includes a base member 115, an insulating layer 111, and metal patterns 113. The solder mask layer 120a is formed on the entire surface of the insulating layer 111 including the metal patterns 113.

Figure 4B:
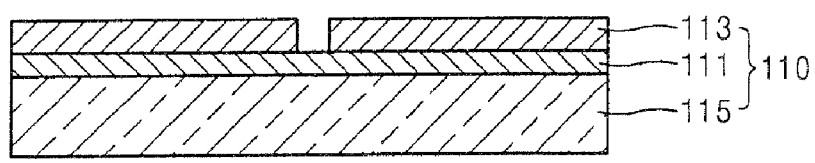
Figure 4C:
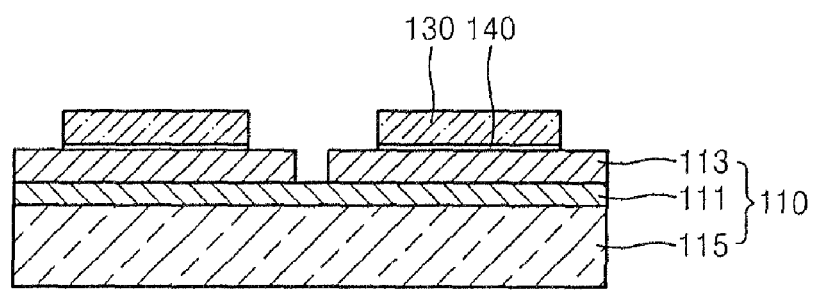
Figure 4D:
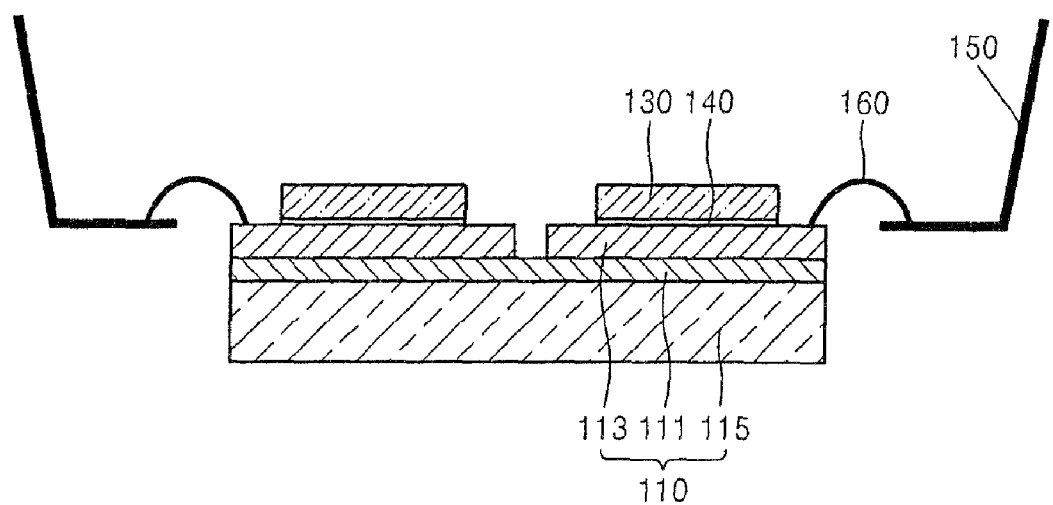

Referring to FIG. 4B, the metal patterns 113 are completely exposed by removing the solder mask layer 120a. Referring to FIG. 4C, semiconductor chips 130 are attached to the semiconductor chip regions on the metal patterns 113 where the semiconductor chips 130 are to be mounted by performing a die bonding process using solder pads 140. Referring to FIG. 4D, the metal patterns 113 are electrically connected to the leads 150 through wires 160. The semiconductor chips 130 may be electrically connected to the metal patterns 113 through wires or may be electrically connected to the leads 150 through wires 160.

A sealing member 170 is formed on an upper surface and side surfaces of the insulating metal substrate 110 to cover the wires 160, the semiconductor chips 130, and portions of the leads 150 and to expose the base member 115 by performing a transfer molding process. The sealing member 170 may include an epoxy resin. Since the sealing member 170 directly contacts on upper and side surfaces of the metal patterns 113 without the solder mask layer 120a interposed therebetween, an interface adhesion force between the sealing member 170 and the insulating metal substrate 110 is increased.

Table 1 summarizes test results regarding insulation breakdown voltage characteristics of the semiconductor package 100 in which a solder mask layer is completely removed or partly removed, according to an embodiment of the present invention and a conventional semiconductor package in which a solder mask layer is not removed.

TABLE 1

| Applying voltage | Measuring point | Sample I | | sample II | |
|---|---|---|---|---|---|
| | | Present invention I | Conventional | Present invention II | conventional |
| AC 2 kV 1 min. | 1 | P | P | P | P |
| | 2 | P | P | P | P |
| | 3 | P | P | P | P |
| | 4 | P | P | P | P |

TABLE 1-continued

| Applying voltage | Measuring point | Sample I | | sample II | |
|---|---|---|---|---|---|
| | | Present invention I | Conventional | Present invention II | conventional |
| AC 3 kV 1 min. | 1 | P | P | P | P |
| | 2 | P | P | P | P |
| | 3 | P | P | P | P |
| | 4 | P | P | P | P |
| AC 4 kV 1 min. | 1 | P | F(46 sec.) | P | F(24 sec.) |
| | 2 | P | F(24 sec.) | P | F(25 sec.) |
| | 3 | P | F(32 sec.) | P | F(05 sec.) |
| | 4 | P | F(10 sec.) | P | F(25 sec.) |
| AC 4.5 kV 1 min. | 1 | P | X | P | X |
| | 2 | P | X | P | X |
| | 3 | P | X | P | X |
| | 4 | P | X | P | X |

The insulation breakdown voltage characteristics of the samples I and II are measured at four locations when 2 kV AC, 3 kV AC, 4 kV AC, and 4.5 kV AC are respectively applied to the samples I and II for 1 minute. The sample I includes the semiconductor package 100 (present invention I) of FIG. 1, in which a solder mask layer is partly removed and a conventional semiconductor package, and the sample II includes the semiconductor package 100 (present invention II) of FIG. 2, in which the solder mask layer is completely removed and a conventional semiconductor package. Different two conventional semiconductor packages are used in the samples I and II.

In Table 1, measuring locations 1, 2, 3, and 4 indicate locations for measuring the insulation breakdown voltage characteristics of the semiconductor package 100 according to the present invention and the conventional semiconductor packages. The four measuring points were arbitrarily selected. "P" denotes that the semiconductor package passes the test since no insulation breakdown occurs under the above voltage applying conditions, and "F" denotes that the semiconductor package does not pass the test since an insulation breakdown occurs under the above voltage applying conditions. For example, "F(46 sec.)" denotes that, when a conventional semiconductor package is tested under a voltage applying condition of 4 kV AC for 1 minute, an insulation breakdown occurs at location 1 of the conventional semiconductor package after applying the 4 kV AC for 46 seconds.

From Table 1, in the case of the semiconductor package 100 in which the solder mask layer is partly removed from the insulation metal substrate 110 and in the case of the semiconductor package 100 in which the solder mask layer is completely removed from the insulation metal substrate 110, an insulation breakdown does not occur even when 4.5 kV Ac is applied for 1 minute. However, in the case of the conventional semiconductor package of sample I, a fail occurs at location 1 in 46 seconds when 4 kV AC is applied, and at location 4 in 10 seconds. Also, in the case of the conventional semiconductor package of sample II, a fail occurs at location 2 after 25 seconds from applying 4 kV AC, and at location 3 after 5 seconds.

Thus, in the semiconductor package 100 according to the embodiments of the present invention, since the solder mask layer that has a weak interface bonding force with the sealing member 170 is partly or completely removed, an area of the sealing member 170 that directly contacts the metal patterns 113 of the insulation metal substrate 110 is greatly increased compared to a conventional semiconductor package in which a solder mask layer is formed on an entire surface of an insulation metal substrate, and thus, an adhesion force between the sealing member 170 and the metal patterns 113 is increased. Thus, poor adhesion at an interface between the insulation metal substrate 110 and the sealing member 170 is increased, thereby improving the insulation breakdown characteristics.

In a semiconductor package and a method of fabricating a semiconductor package according to the present invention, a solder mask layer formed on an insulation metal substrate is partly removed only remaining portions to define die soldering or is completely removed so that conductive patterns of the insulation metal substrate can directly contact a sealing member during performing a transfer molding process, and thus, a bonding force between the insulation metal substrate and the sealing member can be increased. Accordingly, a poor adhesion at an interface between the insulation metal substrate and the sealing member can be improved, thereby increasing an insulation breakdown voltage and insulation characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor package, comprising:
    preparing an insulation metal substrate comprising a base member, an insulating layer arranged on the base member, conductive patterns formed on the insulating layer, and a solder mask layer formed on the insulating layer including the conductive patterns;
    removing the solder mask layer to expose portions of the conductive patterns;
    mounting semiconductor chips on exposed portions of the conductive patterns;
    electrically connecting the conductive patterns to leads through wires; and
    forming a sealing member on an upper surface and side surfaces of the insulation metal substrate to cover the semiconductor chips, the wires, and portions of the leads and to be in contact with remaining exposed portions of the conductive patterns.

2. The method of claim 1 wherein the solder mask layer is patterned to remain around the semiconductor chips or is completely removed.

3. The method of claim 1 wherein the solder mask layer is patterned to define an annular solder mask spaced from the edge of the conductive patterns and exposing a die attach region on the conductive patterns surrounded by said annular solder mask.

4. The method of claim 1 wherein the solder mask layer comprises an epoxy resin.

5. The method of claim 1 wherein the sealing member comprises a transfer molded epoxy resin.

6. The method of claim 1 wherein the conductive patterns are formed of Cu, Au, Ag, Al, or Ni.

7. The method of claim 1 wherein the semiconductor package comprises a power module package.

* * * * *